United States Patent [19]

Magdo et al.

[11] 4,261,003

[45] Apr. 7, 1981

[54] INTEGRATED CIRCUIT STRUCTURES WITH FULL DIELECTRIC ISOLATION AND A NOVEL METHOD FOR FABRICATION THEREOF

[75] Inventors: Ingrid E. Magdo; Steven Magdo, both of Hopewell Junction, N.Y.

[73] Assignee: International Business Machines Corporation, Armonk, N.Y.

[21] Appl. No.: 19,046

[22] Filed: Mar. 9, 1979

Related U.S. Application Data

[60] Continuation of Ser. No. 813,050, Jul. 5, 1977, abandoned, which is a continuation of Ser. No. 566,453, Apr. 9, 1975, abandoned, which is a division of Ser. No. 340,150, Mar. 12, 1973, Pat. No. 3,944,447.

[51] Int. Cl.³ .................... H01L 27/12; H01L 27/02; H01L 29/04
[52] U.S. Cl. ........................... 357/49; 357/4; 357/51; 357/59
[58] Field of Search ................... 357/4, 49, 50, 51, 59

[56] References Cited

U.S. PATENT DOCUMENTS

| 3,381,182 | 4/1968 | Thornton | 357/59 |
|---|---|---|---|
| 3,385,729 | 5/1968 | Larchian | 357/59 |
| 3,602,982 | 9/1971 | Kooi | 357/49 |
| 3,614,558 | 10/1971 | Le Can et al. | 357/59 |
| 3,740,280 | 6/1973 | Ronen | 357/49 |
| 3,743,552 | 7/1973 | Fa | 357/49 |
| 3,784,847 | 1/1974 | Kurz et al. | 357/24 |
| 3,813,584 | 5/1974 | Davidsohn et al. | 357/49 |
| 3,840,412 | 10/1974 | Davidsohn et al. | 357/49 |
| 3,912,556 | 10/1975 | Grenon et al. | 357/59 |

OTHER PUBLICATIONS

Appels et al. "Local Oxidation of Silicon and its Application . . ." Philips Res. Reports vol. 25 (4/70) pp. 118-132.
Kamins "A New Dielectric Isolation Technique for Bipolar Integrated Circuits . . ." Proceeding IEEE (7/72) pp. 915-916.
Morandi "Planox Process Smooths Path to Greater MOS Density" Electronics (12/20/71) pp. 44-48.

*Primary Examiner*—Gene M. Munson
*Attorney, Agent, or Firm*—Theodore E. Galanthay

[57] ABSTRACT

Structure: An integrated circuit structure with full dielectric isolation comprising a supporting substrate having a planar surface of dielectric material and a semiconductor layer on said dielectric surface which forms a planar interface with the surface. Regions of oxidized silicon extend through the layer from said interface, surrounding and dielectrically isolating pockets of silicon in the layer; the oxidized silicon regions extend to the upper surface of the semiconductor layer where they are substantially co-planar with the silicon pockets. The devices of the integrated circuit are formed in said silicon pockets.

Method: The structure is fabricated by a novel method wherein a lightly doped silicon layer is deposited on a highly doped silicon substrate; surrounding oxidized silicon regions are then formed by selectively thermally oxidizing portions of the silicon layer to form oxide regions which are co-extensive with the oxidized areas and, thus, are co-planar with the remaining silicon pockets at both surfaces of the layer; a member having a dielectric surface interfacing with the silicon layer is formed, and the silicon substrate is removed by preferential electrochemical anodic etching to leave the silicon layer having the oxidized regions surrounding spaced silicon pockets mounted on said member.

7 Claims, 30 Drawing Figures

INTEGRATED CIRCUIT STRUCTURES WITH FULL DIELECTRIC ISOLATION AND A NOVEL METHOD FOR FABRICATION THEREOF

This is a continuation of application Ser. No. 813,050 filed July 5, 1977, now abandoned, which is a continuation of application Ser. No. 566,453, filed on Apr. 9, 1975, now abandoned, which is a division of application Ser. No. 340,150, filed on Mar. 12, 1973, now U.S. Pat. No. 3,944,447.

BACKGROUND OF INVENTION

The present invention relates to integrated circuit structures and, more particularly, to dielectric isolation in integrated circuit structures.

The form of most existing integrated circuits is the so-called monolithic form. Such a structure contains great numbers of active and passive devices in a block or monolith of semiconductor material. Electrical connections between these active and passive devices are generally made on a surface of the semiconductor block of material. Until the present, junction isolation has been by far the most widely practiced manner of isolating devices or circuits in the integrated circuit from each other. For example, active P type diffusions are customarily used to isolate conventional and P-N bipolar devices from one another and from other devices such as the resistors and capacitors. Such junction isolation is also used in integrated circuits utilizing field effect transistor devices. More detailed descriptions of junction isolation may be found in U.S. Pat. Nos. 3,319,311; 3,451,866; 3,508,209 and 3,539,876.

Although junction isolation has provided excellent electrical isolation in integrated circuits which have functioned very effectively over the years, at the present stage of the development of the integrated circuit art, there is an increasing demand in the field of digital integrated circuits for faster switching circuits. It has long been recognized that the capacitive effect of the isolating P-N junctions has a slowing effect on the switching speed of the integrated circuits. Up to now, the switching demands of the integrated circuits have been of a sufficiently low frequency that the capacitive effect in junction isolation has presented no major problems. However, with the higher frequency switching demand which can be expected in the field in the future, the capacitive effect produced by junction isolation may be an increasing problem. In addition, junction isolation requires relatively large spacing between devices, and, thus, relatively low device densities which is contrary to higher device densities required in large scale integration. Junction isolation also tends to give rise to parasitic transistor effects between the isolation region and its two abutting regions. Consequently, in recent years there has been a revival of interest in integrated circuits having dielectric isolation instead of junction isolation. In such dielectrically isolated circuits, the semiconductor devices are isolated from each other by insulative dielectric materials.

Conventionally, such dielectric isolation in integrated circuits has been formed by etching channels in a semiconductor member corresponding to the isolation regions. This leaves an irregular or channeled surface over which a substrate, usually a composite of a thin dielectric layer forming the interface with the semiconductor member covered by a thicker layer of polycrystalline silicon is deposited. Then the other surface of the semiconductor member is either mechanically ground down or chemically etched until the bottom portions of the previously etched channels are reached. This leaves the structure wherein a plurality of pockets of semiconductor material surrounded by the dielectric layer are supported on the polycrystalline silicon substrate and separated from each other by extensions or fingers of the polycrystalline substrate. Such structures have been described in the prior art in patents such as U.S. Pat. Nos. 3,391,023; 3,332,137; 3,419,956; 3,372,063; 3,575,740; 3,421,205; 3,423,258; 3,423,255 and 3,478,418.

Complete dielectric isolation, as set forth in the prior art presented by the referenced patents, has had several shortcomings which have prevented it from being fully successful in high speed circuitry where it was particularly needed. Such high speed circuitry requires particularly shallow devices. Thus, the semiconductor pockets were required to be in the order of 0.1 mil in thickness. However, because of wafer handling requirements in semiconductor integrated circuit fabrication techniques, the substrates which had to be etched or ground down were in the order of 6 to 8 mils in thickness. In practicing this prior art, fabricators experienced considerable difficulty in grinding, lapping or etching from 6 to 8 mils of material through a substrate with no inaccuracies which would affect the 0.1 mil pockets.

In addition, the interface between the original semiconductor member and the dielectric polycrystalline composite deposited on such member was, in effect, "corrugated" in cross-section due to the channels which were etched in said semiconductor member. Because of this "corrugated" interface, the opposite surface of the polycrystalline substrate being deposited was also "corrugated". We believe that such corrugations in the bottom surface of the substrate would subject the wafer to unnecessary stresses when pressure was being applied to the integrated circuit wafer or chip during fabrication steps such as thermocompression bonding or when applying probes to the wafer during testing. Such stresses could result in structural defects in the integrated circuit. Also, during wafer processing where it is customary to support the wafer on a heat sink for heat dissipation from the wafer, the corrugated bottom surface of the wafer would reduce the heat transfer to the sink.

In addition, because of the "corrugated" interface, there is no practical manner in which wiring between pockets of semiconductor material could be accomplished utilizing "buried" conductive connectors, e.g., metallic connectors at said interface.

Further, because the fingers of polycrystalline semiconductor material extend into the dielectric isolation between the semiconductor pockets, such prior art dielectrically isolated corrugated structures are still subject to lateral parasitic capacitances between the semiconductor pockets and the fingers of semiconductor material from the supporting substrate.

Recent work in the art appears to have gone a long way in the solution of the problem of removal of the major portion of the semiconductor member to leave the semiconductor pockets. In accordance with the publication "Application of Preferential Electrochemical Etching of Silicon to Semiconductor Device Technology", M. Theunissen et al., *Journal of the Electrochemical Society*, July 1970, pp. 959 to 965, selective anodic electrochemical etching may be used to remove and, thereby, cleanly and accurately separate the major portion of the semiconductor member from the semiconductor pockets in which the devices are to be formed. The publication, and particularly with reference to FIG. 8 thereof, sets forth that by utilizing a semiconductor member having a relatively thick, highly doped substrate and a thinner, lightly doped epitaxial layer in which the grooves are etched prior to the deposition of the dielectric polycrystalline silicon supporting substrate, the highly doped portion of the semiconductor material can be removed by the anodic electrochemical etching technique described to leave the lightly doped pockets of semiconductor material. However, this structure still has the previously described "corrugated" interface as welll as the consequential "corrugated" bottom surface on the polycrystalline silicon supporting substrate.

SUMMARY OF INVENTION

Accordingly, it is an object of the present invention to provide an integrated circuit structure with full dielectric isolation having a planar or flat interface between the semiconductor layer containing the integrated circuit devices and the supporting substrate.

It is another object of the present invention to provide an integrated circuit structure with full dielectric isolation having a supporting substrate with a substantially flat lower or bottom surface.

It is yet another object of the present invention to provide an integrated circuit structure with full dielectric isolation wherein wiring between isolation pockets of semiconductor material may be accomplished utilizing buried metallic connectors at the interface of the semiconductor layer and supporting substrate.

It is yet a further object of the present invention to provide an integrated circuit structure with full dielectric isolation which can more easily withstand pressure during test probing or during bonding.

It is even another object of the present invention to provide a method of forming full dielectric isolation utilizing preferential electrochemical anodic etching which is an improvement over existing methods involving such anodic etching.

In accordance with the present invention, an integrated circuit structure with full dielectric isolation is provided which comprises a supporting substrate having a planar or flat top surface of dielectric material and a bottom surface which is also flat. A semiconductor layer which is supported on said dielectric top surface has a flat surface forming an interface with the dielectric surface and a flat planar upper surface. Regions of oxidized silicon extend from the interface through the semiconductor layer to the upper surface surrounding pockets of unoxidized silicon; the oxidized silicon regions are substantially co-planar with the surrounded silicon pockets at both surfaces of the semiconductor layer. Therefore, both surfaces of the layer are planar.

Preferably, the supporting substrate comprises a polycrystalline silicon member having substantially flat upper and lower surfaces and a layer of dielectric material on said upper surface to provide the dielectric surface. Through this combination of said regions of oxidized silicon in the semiconductor layer together with the layer of dielectric material, the interface between the semiconductor layer and the supporting substrate is substantially flat and not corrugated.

In accordance with another aspect of the present invention, buried conductive connectors, particularly metal connectors, disposed between the polycrystalline silicon member and the semiconductor member interconnect regions of devices formed in said silicon pockets.

The novel structure of the present invention is formed by an improved fabrication method involving preferential electrochemical anodic etching, which method comprises the steps of: forming a layer of low conductivity silicon having a conductivity-determining impurity concentration less than $2 \times 10^{16}$ atoms/cm$^3$ on a silicon substrate having a conductivity-determining impurity concentration greater than $3 \times 10^{18}$ atoms/cm$^3$; forming a protective layer over discrete spaced areas in said silicon layer; thermally oxidizing the unprotected areas in said silicon layer to form silicon dioxide regions coextensive with said oxidized areas surrounding said spaced silicon areas and extending from said substrate through said silicon layer to the protected surface of said spaced silicon areas, and forming on said silicon layer, a member having a planar surface of dielectric material interfacing with the surface of said silicon layer. Thus, by preferential electrochemical anodic etching, the silicon substrate is removed to provide a structure having spaced silicon pockets in said silicon layer, each respectively enclosed by said silicon dioxide regions and said dielectric surface, and forming semiconductor devices in said pockets by the selective introduction of conductivity-determining impurities into the surface of said pockets exposed by the removal of said silicon substrate.

The foregoing and other objects, features and advantages of the invention will be apparent from the following more particular description and preferred embodiments of the invention as illustrated in the accompanying drawings.

DESCRIPTION OF THE PREFERRED EMBODIMENTS

With reference to FIGS. 1A–1K, there is illustrated a primary method for fabricating the novel structure of the present invention. For purposes of illustration, the devices in the integrated circuit are primarily NPN type transistors. It should, of course, be understood that the invention will also be applicable to opposite type conductivities as well as to other devices. It should further be noted that when the term different conductivities is used with reference to device regions, it is meant to cover regions of different conductivity types, e.g., P and N types as well as regions of significantly different conductivity levels, e.g., N type and N+ type.

On a suitable N+ wafer substrate 10, preferably having a conductivity-determining impurity or dopant concentration greater than $3 \times 10^{18}$ atoms/cm$^3$ of a dopant, preferably arsenic or antimony, there is formed N− epitaxial layer 11 having an impurity concentration or doping level of less than $2 \times 10^{16}$ atoms/cm$^3$ by conventional epitaxial deposition techniques conducted at a low temperature in the order of 800° to 1,000° C. at a pressure in the order of 0.1 atmospheres or larger. A low temperature epitaxial deposition is desirable in order to minimize autodoping and outdiffusion at the substrate epitaxial interface. The epitaxial thickness is preferably in the order of from 0.5 to 3 microns depending on the performance requirements of the devices. For purposes of illustration, assume that the epitaxial layer is 2 microns in thickness. Epitaxial layers may be formed using the apparatus and method described in U.S. Pat. No. 3,424,629.

Figure 1A:
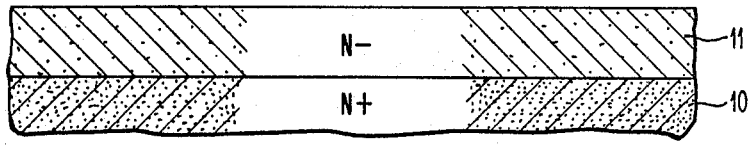
FIGS. 1A–1K show diagrammatic sectional views of a portion of an integrated circuit in order to illustrate the method of fabricating the preferred embodiment of the present invention.
Figure 1B:
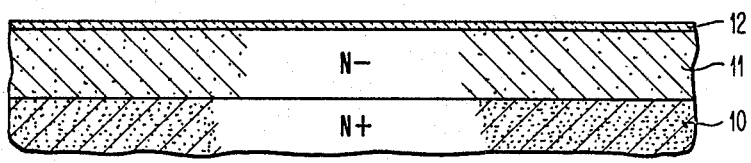

Then, FIG. 1B, a protective layer 12 is applied using known techniques such as pyrolytic deposition or cathode sputtering. The protective layer is preferably a dielectric material, such as aluminum oxide or silicon nitride, which can be formed by the pyrolytic technique of the reaction of silane and ammonium or other nitrogen-containing compound as described in the V. Y. Doo et al. patent application, Ser. No. 142,013, filed May 10, 1971. The silicon nitride layer which is deposited at a temperature in the order of 970° C. has a thickness in the order of 1,000 Å. It should be noted that instead of using a layer of nitride alone, layer 12 may be a composite of silicon dioxide covered with silicon nitride. Such a composite may be desirable in reducing thermal stresses between the protective coating and the underlying epitaxial layer 11. This composite may be easily formed by thermally oxidizing the surface of layer 11 to silicon dioxide having a thickness in the order of from 500 Å to 1500 Å prior to the previously described deposition of the silicon nitride layer.

Figure 1C:
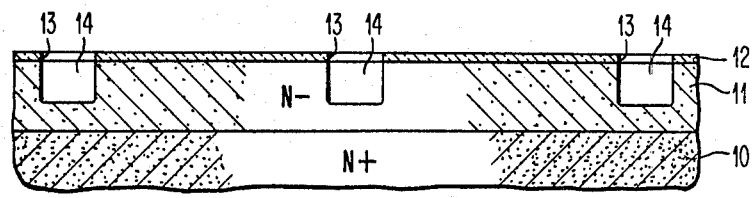
Figure 1D:
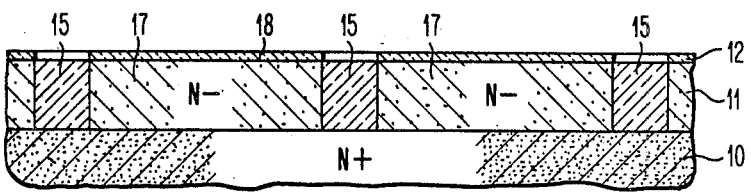
Figure 1E:
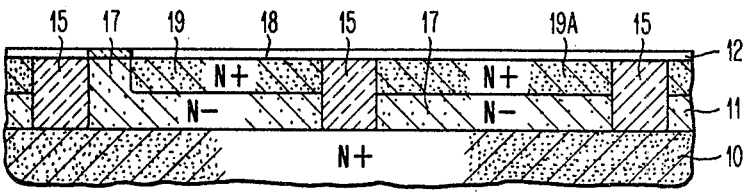

Next, as shown in FIG. 1C, portions 13 of the protective layer 12 are etched away. A suitable etchant for silicon nitride is hot phosphoric acid or hot phosphoric salt. Where the previously described composite is used for layer 12, the underlying oxide layer may be removed by a suitable conventional etchant such as buffered HF. Next, as shown in FIG. 1C, protective layer 12 is used as a mask and the epitaxial layer 11 is partially etched away in regions 14 using a suitable etchant for silicon, such as nitric acid, mercuric nitrate, and diluted hydrofluoric acid. This results in the mesa-like final structure shown in FIG. 1C. The structure is then put through an oxidation cycle wherein it is placed in an oxidation atmosphere at an elevated temperature, in the order of 970° C., with or without the addition of water, to produce silicon dioxide regions 15 which extend substantially from the upper surface of epitaxial layer 11 to interface 16 between the epitaxial layer and the substrate. The oxidation is continued until regions 15 are substantially co-planar with the surface of remaining epitaxial layer 11. It should be noted that a portion of the silicon of layer 11 is consumed in the oxidation process, thereby permitting silicon dioxide regions to extend down to interface 16. Silicon dioxide regions 15 completely surround pockets 17 of the remaining epitaxial silicon layer. This process for forming the surrounding oxide regions 15 in FIG. 1D is fully described in our copending application Ser. No. 150,609, filed June 7, 1971. In order that the oxidation to form regions 15 may be carried out so that the oxidation reaches interface 16 at or before the time the oxidation reaches the surface of epitaxial layer 11, etched recesses 14, FIG. 1C, must be etched to a depth of about one-half the thickness of epitaxial layer 11. Since it is very important to insure that silicon dioxide regions 15 reach interface 16, the formation of silicon dioxide regions 15 may be carried out under such conditions that they extend beyond interface 16 in the order of several thousand angstroms into substrate 10.

Where, as in the present embodiment, it is desired to form regions in isolated silicon pockets 17 which will serve as buried regions in the completed integrated circuit structure, protective layer 12 may be partially removed and such buried regions formed through the introduction of impurities into surface 18 of remaining layer 11 by conventional means, such as diffusion, utilizing the remaining portions of protective layer 12 in combination with imbedded silicon dioxide regions 15 to define the buried regions. In this connection, with reference to FIG. 1E, N+ region 19 is formed by a diffusion through surface 18 and is defined by the combination of remaining protective layer 12 and abutting silicon dioxide region 15. On the other hand, region 19A is formed in the same diffusion step but is only defined by surrounding silicon dioxide regions 15. Regions 19 and 19A may be formed by any conventional thermal diffusion of impurities, such as phosphoric arsenic antimony or the like, to a N+ surface concentration. The diffusion may be made by the conventional open or closed tube thermal diffusion techniques.

Figure 1F:
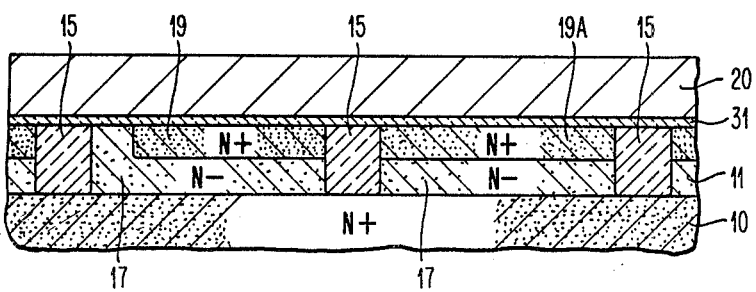
Figure 1G:
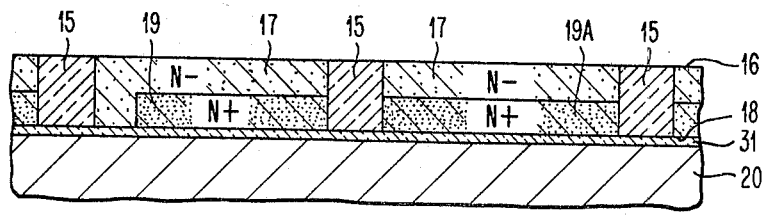

A dielectric passivating and protective layer is then formed completely covering surface 18. This layer 31, which is shown in FIG. 1F, has a thickness in the order of 1 to 4 microns and may be any convenient dielectric material, such as alumina, silicon dioxide, either formed by the thermal oxidation of surface 18 or by pyrolytic deposition of sputtered silicon dioxide or silicon nitride. It should be noted that where layer 31 is formed by the thermal oxidation of the silicon surface 18, then the previously described formation of imbedded silicon dioxide regions 15 should be carried out under such conditions that they extend beyond the surface 18 for a distance in the order of what will be the final thickness of layer 31. Such an expedient will insure that layer 31 is substantially flat because the surface of regions 15 cannot be thermally oxidized.

Next, the previously described low temperature epitaxial deposition of silicon is carried out to deposit a layer of silicon 20 in the order of 2 to 15 mils depending on wafer ride, e.g., for a 2¼ inch wafer, a thickness of 8 to 10 mils is preferable. This layer will serve as the support or carrier in the final integrated circuit structure. Because of the composition of layer 31, epitaxial layer 20 will be polycrystalline silicon rather than monocrystalline silicon as is layer 11. In this embodiment, layer 20 is substantially undoped. In order to minimize outdiffusion in the structure, the deposition of polycrystalline layer 20 is preferably carried out at a temperature of between 600° C. to 900° C., utilizing a silane source for the silicon.

Next, utilizing the preferential anodic electrochemical etching procedure described in the previously mentioned publication in the Journal of the Electrochemical Society, July 1970, M. Theunissen et al., N+ substrate 10 is selectively etched away to leave the structure shown in FIG. 1G. The following etching conditions which are described in said publication may be used: $V_{anode-cathode}=10$ volts; the electrolite is a 5% aqueous HF solution; bath temperature 18° C.; complete darkness; the cathode is platinum gauze; the cathode is parallel to the structure being sliced at a distance of about 5 cms. As a result of this preferential etching, substrate 10 is cleanly removed, leaving former interface, surface 16, cleanly exposed.

Figure 1H:
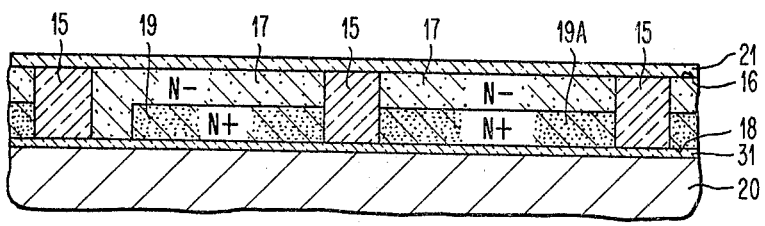

Next, a masking and passivating protective layer 21, FIG. 1H, is formed on surface 16. This layer may be silicon nitride or pyrolytically deposited silicon dioxide. However, we have found that highly desirable results may be achieved by forming layer 21 of silicon dioxide by thermal oxidation. Where layer 21 is thus formed by thermal oxidation, it is advantageous when fabricating imbedded silicon dioxide regions 15 back in the step of FIG. 1D, to conduct the process so that, as previously mentioned, regions 15 extend into substrate 10 for a distance equivalent to the thickness of the subsequently to be formed layer 21. In such a case, when as in FIG. 1H, silicon dioxide layer 21 is being formed by thermal oxidation, surface 16 will be oxidized only in the areas over silicon pockets 17 and not in the areas over silicon dioxide regions 15. As a result, in the areas being oxidized, the silicon dioxide will build up to levels equivalent and coplanar with the extended portions of silicon dioxide regions 15 to produce a substantially flat surface on layer 21.

Figure 1I:
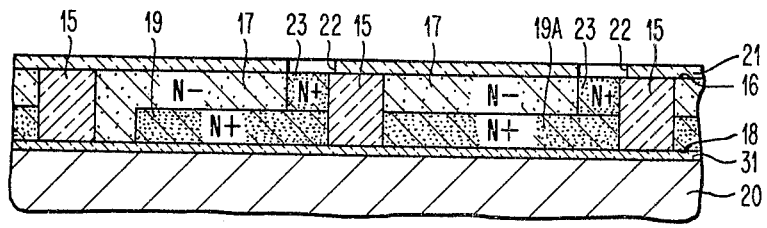

Next, as shown in FIG. 1I, J, and K, utilizing the passivation and masking properties provided by layer 21 and its equivalent subsequently applied layers, the devices within silicon pocket 17 are completed by the selective introduction of impurities through surface 16, e.g., by diffusion. With reference to FIG. 1I, openings 22 are made in the protective layer. This may be done by standard photoresist techniques with a suitable etchant such as hydrofluoric acid. Through these openings, collector reach-through regions 23 are formed by diffusions utilizing a suitable N dopant, e.g., a capsule phosphorus diffusion. In forming openings 22, they are positioned so that regions 23 abut imbedded silicon dioxide regions 15. In this manner, alignment problems are minimized, in that openings 22 may, as shown in FIG. 1I, overlap imbedded silicon dioxide regions 15 whereby masks 21 in combination with regions 15 serve to define diffused regions 23.

Figure 1J:
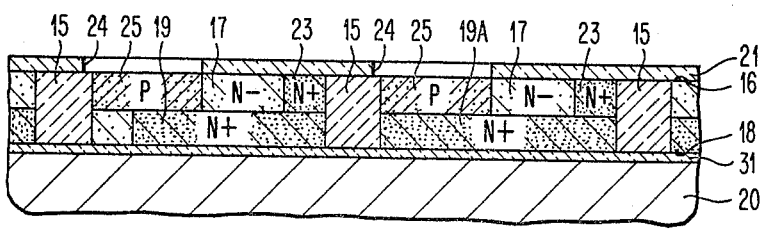

Next, as diagrammatically shown in FIG. 1J, openings 22 are closed by a standard reoxidation and new openings 24 are made in the protective layer, through which openings P type regions 25 which will serve as the base regions for the devices are formed by diffusion. The base diffusion may be made by a suitable open tube or close tube process of the prior art utilizing a P type dopant such as boron. It is to be noted that like regions 23, base regions 25 also abut imbedded silicon dioxide surrounding regions 15, thereby providing the previously described alignment advantage wherein the protective layer in combination with the imbedded silicon dioxide regions surrounding the base serve to define the base regions.

Figure 1K:
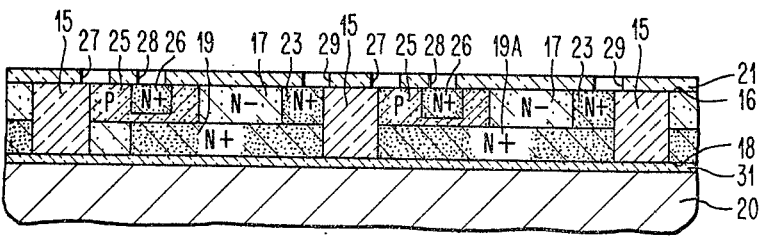

Then, as shown in FIG. 1K, following the base diffusion, surface 16 is again reoxidized, appropriate openings formed and N+ emitter regions 26 are formed by conventional techniques using a N type impurity such as arsenic, phosphorus or antimony. Openings 27, 28 and 29 are then provided in the insulative layer to respectively serve as the base, emitter and collector contacts of FIG. 1K. It should be noted that in forming the base and collector contacts 27 and 29, the above-mentioned alignment advantage is again utilized by having these openings overlap silicon dioxide regions 15, whereby regions 15 in combination with the insulative layer serve to define the contact areas.

It should be noted that sub-collectors 19 and 19A are shown to be of different horizontal dimensions. This is merely for the purpose of illustrating the aforementioned processing techniques; the size differential has no structural significance except that collector 19 would have a lower collector-base capacitance than would collector 19A.

Figure 2A:
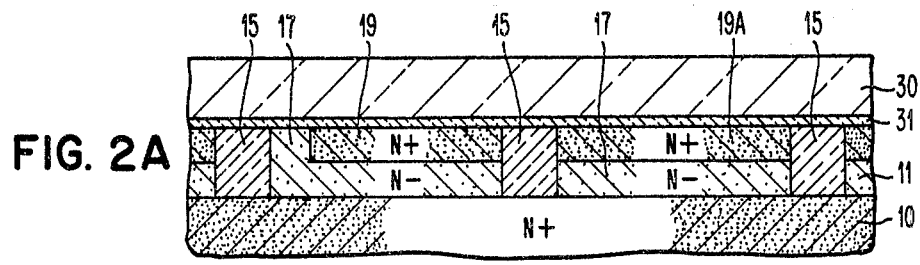
FIGS. 2A and 2B show diagrammatic sectional views of a portion of an integrated circuit of another embodiment of the present invention, the views being selected to illustrate particular fabrication steps.
Figure 2B:
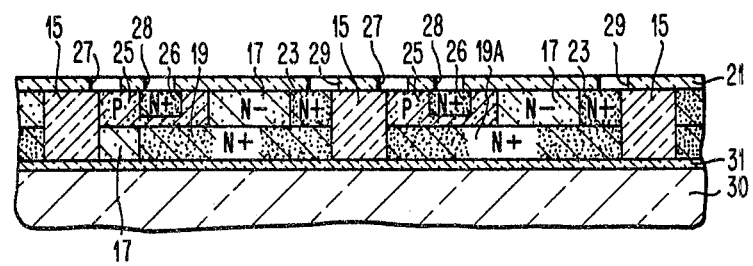

As shown in FIGS. 2A and 2B, the supporting substrate or carrier for the integrated circuit in an alternative embodiment need not be polycrystalline silicon; it may be made up entirely of dielectric material. In the step of FIG. 2A which is an alternative for the step of FIG. 1F, a layer of dielectric material 30 is deposited on layer 31 instead of a polycrystalline silicon layer. In forming the structure of FIG. 2A, a procedure identical to that shown in FIGS. 1A–1E is first carried out and then the step of FIG. 2A substituted for the step of FIG. 1F. Layer 30 has substantially the same thickness as the layer of polycrystalline silicon would have. The dielectric material selected for layer 30 should have a thermal coefficient of expansion sufficiently similar to that of silicon so that stresses during thermal processing are minimized. Accordingly, layer 30 may be a material such as silicon dioxide or alumina. The structure of FIG. 2B is equivalent to the final structure shown in FIG. 1K except that dielectric layer 30 is used in place of polycrystalline silicon layer 20.

In an even further variation of the embodiment of FIGS. 2A and 2B, a single dielectric layer may be used in place of layers 31 and 30. For example, if protective layer 31 were a material such as silicon dioxide or alumina, this layer could be built up to a thickness in the order of about 5 or 6 mils and, thus, serve the function of layers 31 and 30.

With reference now to FIGS. 3A–3D, there will briefly be described how the application method described in FIGS. 1A–1K may be used to fabricate a pair of complementary bipolar transistors with full dielectric isolation. First, after following a procedure substantially identical to that described with respect to the steps in FIGS. 1A–1D, an opening 32 is etched in protective layer 33 which uncovers the surface of silicon pocket 34; then, by a suitable diffusion step as described above, N+ sub-collector region 35 is produced.

Figure 3A:
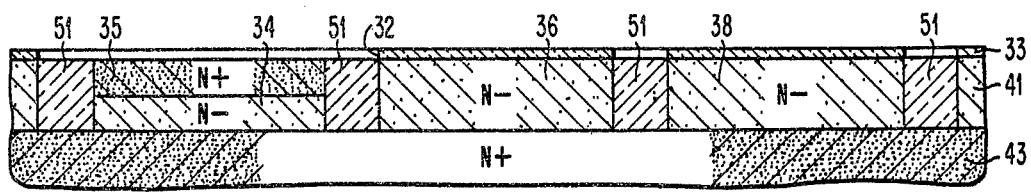
FIGS. 3A–3D show diagrammatic sectional views of a portion of an integrated circuit illustrating the fabrication steps of another embodiment of the present invention.
Figure 3B:
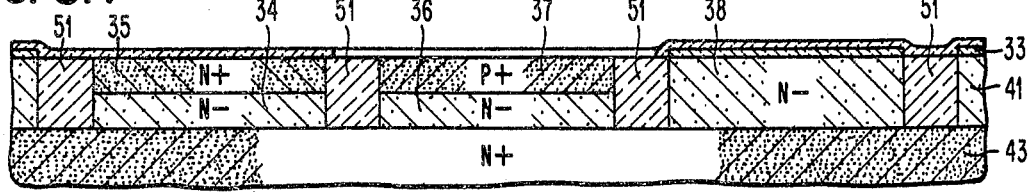
Figure 3C:
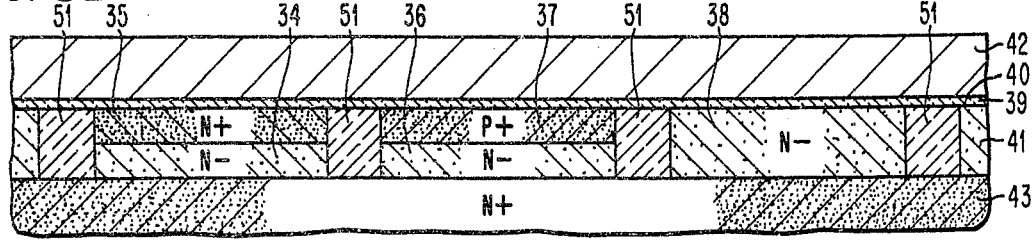

Next, as shown in FIG. 3B, the protective layer is reformed over region 35, and a second opening is formed at the surface of silicon pocket 36 through which P+ diffused region 37 is formed. This P+ region will serve as a sub-collector in the PNP transistor. For purposes of illustration, no diffusion has been made into N-silicon pocket 38. In the final device structure, this region can serve as a resistor.

Next, still following the procedure set forth in FIG. 1F, a layer of dielectric material 39 is formed completely covering surface 40 of semiconductor layer 41 and a layer of polycrystalline silicon 42 is formed on the surface of dielectric layer 39.

Figure 3D:
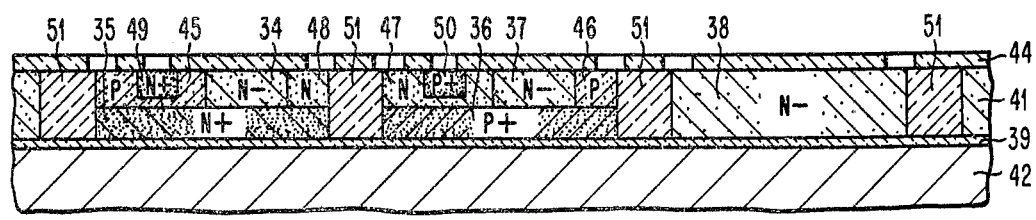

Then, following the procedure set forth in FIGS. 1G–1K, N+ substrate 43 is removed by anodic electrochemical etching, followed by a series of diffusions through protective and masking layer 44 to form the complementary NPN and PNP transistors T1 and T2 of FIG. 3D. P base region 45 is formed simultaneously with P collector reach-through 46, and N base region 47 is formed simultaneously with N collector reach-through 48. N+ emitter 49 and P+ emitter 50 are then formed in a pair of diffusion steps, after which appropriate base, collector and emitter contact holes are opened through protective layer 44 to the active regions in transistors T1 and T2. Contacts are also opened to N− region 38 which may serve as a resistor. The result is the structure shown in FIG. 3D wherein the complementary devices in the integrated circuit are carried on polycrystalline silicon substrate 42 and are fully dielectrically isolated through the combination of dielectric layer 39 and surrounding imbedded silicon dioxide regions 51.

Figure 4A:
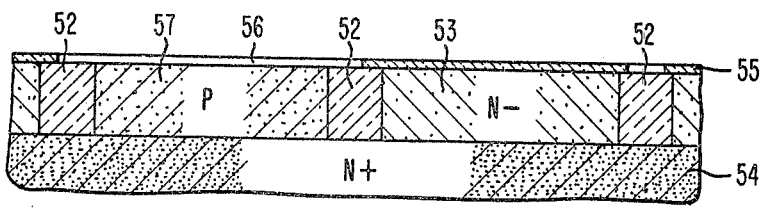
FIGS. 4A–4F show diagrammatic sectional views of a portion of an integrated circuit illustrating the fabrication steps involved in still another embodiment of the present invention.
Figure 4B:
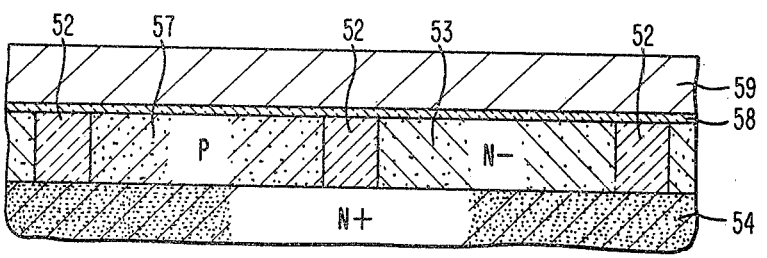
Figure 4C:
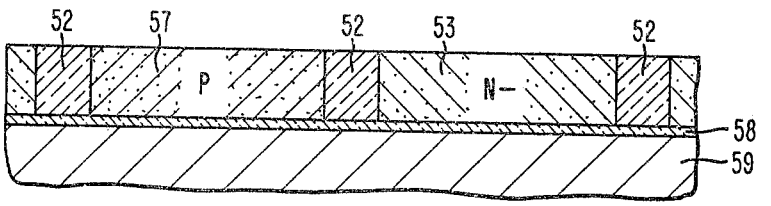
Figure 4D:
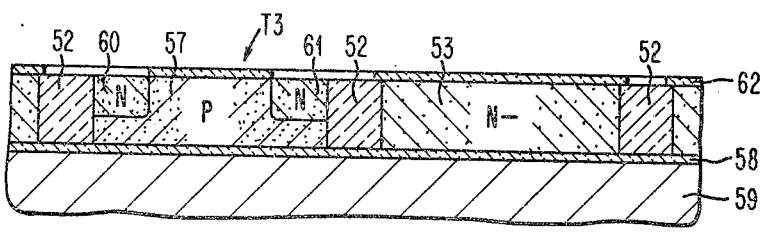
Figure 4E:
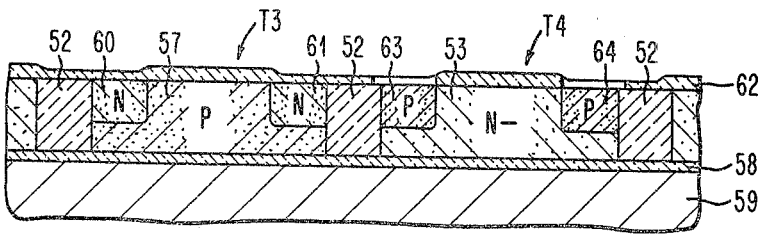
Figure 4F:
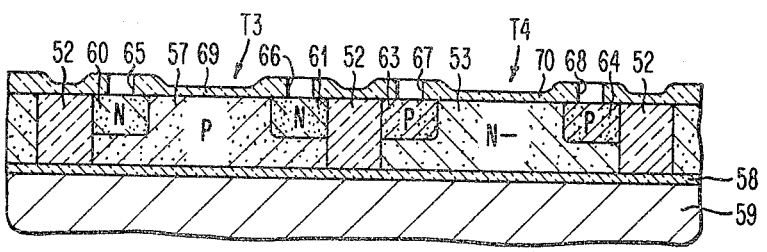

With reference to FIGS. 4A–4F, there will now be described how structure and method of the present invention may be utilized to form a pair of complementary field effect transistors. First, following the procedures of FIGS. 1A–1D, we form a structure wherein imbedded silicon dioxide regions 52 fully enclose pockets of N− silicon 53 mounted on N+ substrate 54 and covered by protective layer 55. First, as shown in FIG. 4A, an opening 56 is formed over one of the silicon pockets and by diffusion the N− silicon region is converted into a P region 57. Next, in accordance with the procedure of FIG. 1F, a uniform dielectric layer 58 (see FIG. 4B), is formed upon which a polycrystalline layer 59 is deposited. Next, as shown in FIG. 4C, N+ substrate 54 is removed by preferential anodic electrochemical etching, after which, as shown in FIG. 4D, a pair of N regions 60 and 61 are diffused into P region 57 to form the source and drain field effect transistor T3. Subsequently, after protective coating 62 is reformed, P regions 63 and 64 are formed in N− pocket 53. These will serve as the source and drain for field effect transistor T4, FIG. 4E. Then, after the relatively thick insulative coating is removed by stripping from the gate regions and replaced by a thin insulative coating in the conventional manner, there is formed the final structure shown in FIG. 4F, where appropriate contact openings 65, 66, 67 and 68 are made respectively to the source and drains of transistors T3 and T4. When appropriate metallization is applied to the source and drains, as well as to gate regions 69 and 70 of the transistors, the resulting structure represents a complementary pair of field effect transistors.

Figure 5A:
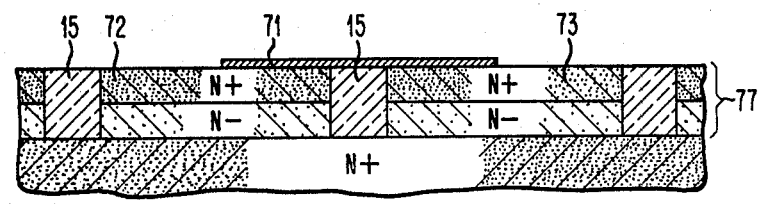
FIGS. 5A–5D show diagrammatic sectional views of a portion of an integrated circuit illustrating the fabrication method involved in a further embodiment of the present invention.
Figure 5B:
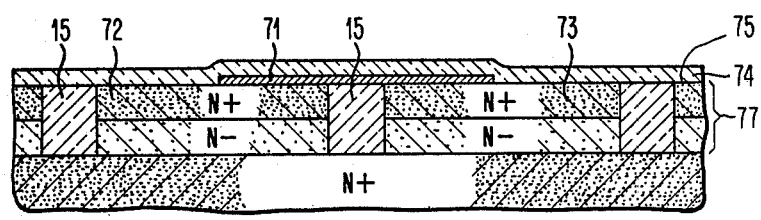
Figure 5C:
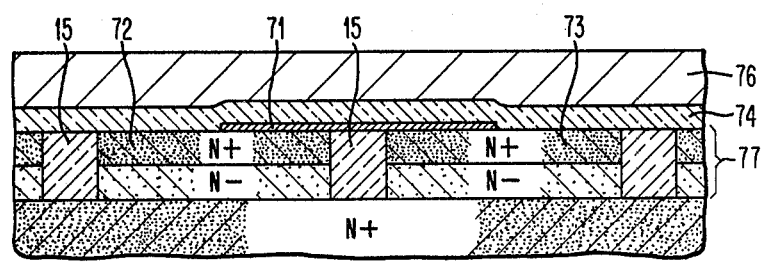
Figure 5D:
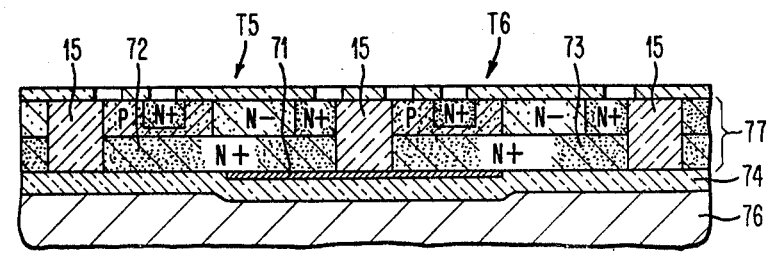

It has been previously noted that the structure of the present invention is such that conductive interconnections may be made between regions in the devices along the interface between the semiconductor integrated circuit layer and the supporting polycrystalline silicon/dielectric substrate or carrier. This aspect of the present invention will now be described with reference to FIGS. 5A–5D. In forming the structure shown in 5A, the steps shown in FIGS. 1A–1E are followed, after which a very thin metallic conductor in the order of 7000 Å to 12,000 Å in thickness is deposited to interconnect selected buried regions, e.g., in FIG. 5A, metallic connector 71 connects buried sub-collectors 72 and 73. Next, a layer of dielectric material 74 similar to layer 31 in FIG. 1F is deposited over connector 71 and the entire surface 75, FIG. 5B. Next, polycrystalline layer 76 is formed in the manner previously described, FIG. 5C, and the procedure of FIGS. 1G–1K followed to provide the structure of 5D wherein buried metallic connector 71 at the interface of semiconductor layer 77 and the supporting substrate which is a composite of dielectric layer 74 and polycrystalline silicon member 76 interconnects sub-collectors 72 and 73 of respective transistors T5 and T6. While buried sub-collectors 72 and 73 have been shown extending across their respective pockets, they may be reduced in lateral dimensions so as to correspond to emitter dimensions. In such a case, the sub-collectors would be positioned directly under the emitters. As a result of the smaller sub-collectors, collector-base capacitances would be substantially reduced.

It should also be noted that the metallic connectors, such as connector 71, formed at the interface need not necessarily contact the interface surface of the semiconductor pocket. Such connectors may be connected to the top surface of the semiconductor layer by metallization passing through the silicon dioxide regions 15. In this manner, up to several layers of interconnector metallurgy may be formed at the interface between the underside of the semiconductor layer and the supporting substrate. This metallurgy may be connected to the top planar surface of the semiconductor layer by conductive connectors passing through silicon dioxide regions 15.

It should be noted that metallic interconnector 71 may be any metal conventionally utilized in semiconductor structures, e.g., platinum, molybdenum or tungsten. The metallic interconnector may be deposited by conventional photolithographic techniques utilized in the integrated circuit art to form metallic interconnectors.

Alternatively, connector 71 may be a conductive semiconductor member. In such a case, a thin semiconductor layer, in the order of 0.5 to 1.0 microns in thickness may be deposited over surface 77 in FIG. 5A in place of a metallic deposition. This semiconductor layer should, of course, be of the same conductivity type as regions 72 and 73 and preferably doped to an N+ layer. Next, the portion of the semiconductor layer which is to form the connector between regions 72 and 73 is appropriately masked and the remainder of the layer oxidized, e.g., to form silicon dioxide. Then, the dielectric and polycrystalline silicon composite substrate may be deposited in the manner described with respect to FIG. 1F.

It should be understood that a voltage supply may be attached to a buried connector pattern, such as pattern 71, in order to apply a potential supply to the collector of the transistor. In such a case, contacts to connector pattern 71 may be made through the bottom surface of polycrystalline silicon layer 76 in combination with a corresponding opening in dielectric layer 74.

In accordance with another embodiment of this invention, the present structure may be utilized for connection of power sources to the collector of a plurality of transistors in an integrated circuit through the back side of the chip.

Figure 6:
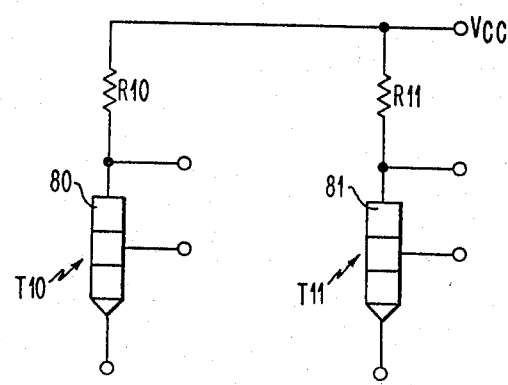
FIG. 6 is a schematic circuit diagram of a circuit having common collector powering which may be embodied by the structure of the present invention.
Figure 7:
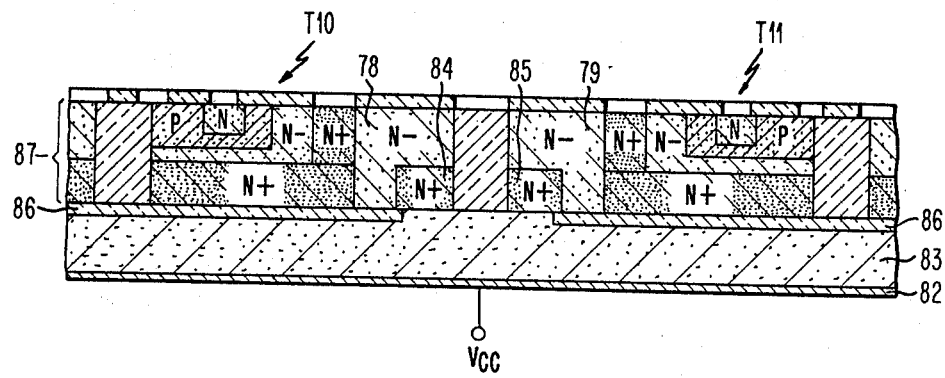
FIG. 7 is a diagrammatic sectional view of an integrated circuit in accordance with the present invention which embodies the circuit shown in FIG. 6.

FIG. 6 shows a conventional circuit with a collector power source $V_{cc}$ being connected to a plurality of transistors, T10, T11, through collector resistors, R10, R11, to collectors 80 and 81. Since collector power source $V_{cc}$ is common to all of the collectors in the circuit, the circuit shown in FIG. 6 may be provided by the structure shown in FIG. 7. Since this structure may be fabricated in accordance with the above-described fabrication techniques, such techniques will not again here be described. Source $V_{cc}$ is connected to a layer of metal 82, which may be aluminum, formed on the underside of polycrystalline silicon supporting substrate 83. Polycrystalline substrate 83 is doped so as to be relatively conductive between source $V_{cc}$ and respective collector contacts 84 and 85 of transistors T10 and T11. N− regions 78 and 79 provide resistors R10 and R11. Insulative layer 86 insulates polycrystalline substrate 83 from the remainder of the silicon layer 87.

Figure 8:
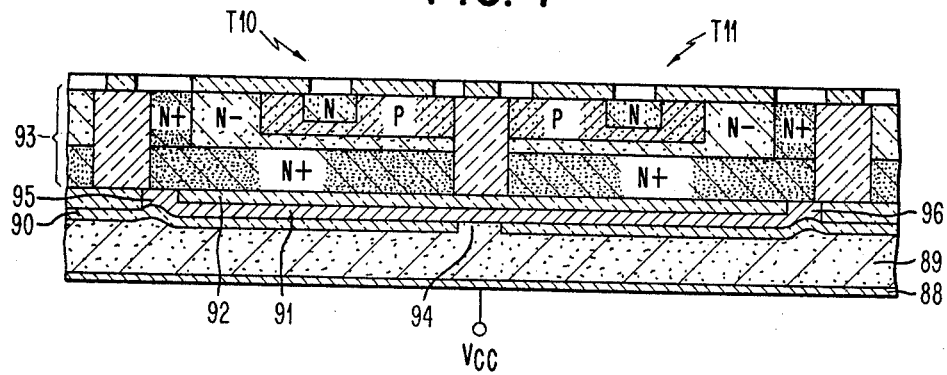
FIG. 8 is a diagrammatic sectional view of another embodiment in accordance with the present invention of the circuit shown in FIG. 6.

In the structure shown in FIG. 8, which is another embodiment in accordance with the present invention of the circuit in FIG. 6, source $V_{cc}$ is connected to metallic contact layer 88 formed on doped polycrystalline silicon substrate 89. Insulative layer 90 separates polycrystalline substrate 89 from an undoped polycrystalline layer 91 sandwiched between insulative layer 90 and insulative layer 92 abutting silicon layer 93. In this structure, polycrystalline substrate 80 is doped so as to provide a conductive path between source $V_{cc}$ and undoped polycrystalline layer 91 through aperture 94. Undoped polycrystalline silicon layer 91, which is respectively connected to the collectors of transistors T10 and T11 through apertures 95 and 96, primarily provides resistance R10 and R11.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An integrated circuit structure with full dielectric isolation comprising:
   a supporting member including a polycrystaline supporting substrate having at least a first planar surface and a first layer of dielectric material covering said substrate on said at least first planar surface and forming a second planar surface;
   a second layer on said second planar surface and forming a third planar surface; parallel to said second surface;
   said second layer including a plurality of monocrystalline silicon pockets isolated from each other and laterally surrounded only by regions of oxidized silicon extending from said second planar surface through said second layer to said third planar surface, said second and third surfaces being fully planar and no portion of said supporting member extends beyond a plane defined by said second planar surface, said regions of oxidized silicon being substantially coplanar with the silicon pockets at both the second and third surfaces;
   said silicon pockets including regions of one conductivity type with a relatively low conductivity;
   a first one of said silicon pockets having a subcollector region of one conductivity type with a relatively high conductivity fully covering the second planar surface portion within said first pocket;
   a second one of said silicon pockets having a subcollector partially covering the second planar surface portion within said second pocket, the remaining portion of said second planar surface portion within said second pocket being covered by a residual portion of one conductivity type with a relatively low conductivity of said second layer;
   base and emitter regions of opposite and one conductivity types, respectively, formed in said first and second pockets, the base region in said second pocket being partially formed over said residual portion of said second layer.

2. An integrated circuit structure with full dielectric isolation comprising:
   a supporting member including a polycrystalline supporting substrate having at least a first surface and a first layer of dielectric material covering said substrate on said at least first surface and forming a second surface;
   a conductive connector embedded in said first layer, one surface of said embedded conductor being coplanar with said second surface and forming a fully planar surface therewith;
   a second layer on said fully planar surface and forming a third planar surface parallel to said fully planar surface, said second layer including a plurality of monocrystalline pockets isolated from each other and laterally surrounded only by regions of oxidized silicon extending from said second surface completely through said second layer to said third surface and respectively surrounding each pocket, said regions of oxidized silicon being substantially coplanar with the silicon pockets at both said third and fully planar surfaces;
   said silicon pockets including regions of one conductivity type with a relatively low conductivity;
   each of said silicon pockets having a subcollector of one conductivity type with a relatively high conductivity at least partially covering the said fully planar surface portion within each pocket, each of said silicon pockets further having a base region of opposite conductivity type, at least a portion of said base region being butted against said regions of oxidized silicon, each of said silicon pockets further having an emitter of one conductivity type formed within a portion of each of said base regions;
   the embedded conductor being disposed between said first and second surfaces extending under a region of oxidized silicon and forming an electrical connection between at least two of said subcollectors, such that no portion of said embedded conductor extends beyond said first and fully planar surfaces.

3. An integrated circuit structure as in claim 2 wherein said conductive connector comprises polycrystalline silicon.

4. An integrated circuit structure as in claim 2 wherein said conductive connector comprises a metal from the group consisting of platinum, molybdenum, or tungsten.

5. An integrated circuit structure as in claim 2 further comprising:
   a conductor extending from said conductive connector through said region of oxidized silicon.

6. An integrated circuit structure with full dielectric isolation comprising:
   a supporting member including a polycrystalline supporting substrate and a first layer of dielectric material on said substrate having a fully planar surface;

a second layer on said fully planar surface and forming a third planar surface parallel to said fully planar surface, said second layer including a plurality of monocrystalline pockets isolated from each other and laterally surrounded only by regions of oxidized silicon extending from said fully planar surface completely through said second layer to said third surface and respectively surrounding each pocket, said regions of oxidized silicon being substantially coplanar with the silicon pockets at both said third and fully planar surfaces;

said silicon pockets including regions of one conductivity type with a relatively low conductivity;

each of said silicon pockets having a subcollector of one conductivity type with a relatively high conductivity at least partially covering the said fully planar surface portion within each pocket, each of said silicon pockets further having a base region of opposite conductivity type, at least a portion of said base region being butted against said regions of oxidized silicon, each of said silicon pockets further having an emitter region of one conductivity type formed within a portion of each of said base regions;

a buried resistive connector embedded in said supporting member, said buried resistive connector extending through apertures in said first layer to contact at least two of said subcollector regions, no portion of said resistive connector extending through a plane defined by said fully planar surface; and an insulative layer disposed between said buried resistive connector and said polycrystalline supporting substrate having an aperture through which said polycrystalline substrate extends to contact said buried resistive connector.

7. An integrated circuit structure as in claim 6 additionally comprising:

a metallic contact layer covering said polycrystalline supporting substrate on another surface remote from said dielectric material and in a plane parallel to said fully planar surface; and an electrical terminal joined to said metallic contact layer.

* * * * *